(12) United States Patent
Lim et al.

(10) Patent No.: US 9,788,438 B2
(45) Date of Patent: Oct. 10, 2017

(54) PRINTED CIRCUIT BOARD FOR MEMORY CARD

(71) Applicant: LG INNOTEK CO., LTD., Seoul (KR)

(72) Inventors: Seol Hee Lim, Seoul (KR); Yun Kyoung Jo, Seoul (KR); Ae Rim Kim, Seoul (KR); Sai Ran Eom, Seoul (KR); Chang Hwa Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 262 days.

(21) Appl. No.: 14/368,210

(22) PCT Filed: Dec. 12, 2012

(86) PCT No.: PCT/KR2012/010789
§ 371 (c)(1),
(2) Date: Jun. 23, 2014

(87) PCT Pub. No.: WO2013/094922
PCT Pub. Date: Jun. 27, 2013

(65) Prior Publication Data
US 2014/0369016 A1    Dec. 18, 2014

(30) Foreign Application Priority Data
Dec. 21, 2011   (KR) .................. 10-2011-0139628

(51) Int. Cl.
*H01R 9/00*    (2006.01)
*H05K 3/30*    (2006.01)
(Continued)

(52) U.S. Cl.
CPC .............. *H05K 3/301* (2013.01); *C25D 3/12* (2013.01); *C25D 3/16* (2013.01); *C25D 3/48* (2013.01);
(Continued)

(58) Field of Classification Search
CPC ................ H05K 1/11; H05K 1/111; H05K 1/117–1/118; H05K 1/181;
(Continued)

(56) References Cited

U.S. PATENT DOCUMENTS 8,487,192 B2 *   7/2013   Kunieda ............. H01L 21/6835
174/255
2008/0258299 A1 *  10/2008   Kang .................... H01L 24/83
257/737

FOREIGN PATENT DOCUMENTS

CN       101363817 A    2/2009
JP       2008-050673 A  3/2008
(Continued)

OTHER PUBLICATIONS

Office Action dated Aug. 3, 2016 in Chinese Application No. 201280064180.9.
(Continued)

*Primary Examiner* — Tuan T Dinh
(74) *Attorney, Agent, or Firm* — Saliwanchik, Lloyd & Eisenschenk

(57) ABSTRACT

The printed circuit board for the memory card includes an insulating layer; a mounting unit formed on a first surface of the insulating layer and electrically connected to a memory device; a terminal unit formed on a second surface of the insulating layer and electrically connected to electronic apparatuses of an outside; and metal layers formed at the mounting unit and the terminal unit and made of the same material.

5 Claims, 11 Drawing Sheets

(51) Int. Cl.
  *H05K 1/11* (2006.01)
  *H05K 3/24* (2006.01)
  *C25D 3/12* (2006.01)
  *C25D 3/16* (2006.01)
  *C25D 3/48* (2006.01)
  *C25D 3/50* (2006.01)
  *C25D 3/56* (2006.01)
  *C25D 3/62* (2006.01)
  *C25D 5/12* (2006.01)
  *H05K 1/09* (2006.01)
  *H05K 1/18* (2006.01)
  *H05K 3/18* (2006.01)
  *C23C 18/16* (2006.01)

(52) U.S. Cl.
  CPC ............... *C25D 3/50* (2013.01); *C25D 3/562* (2013.01); *C25D 3/567* (2013.01); *C25D 3/62* (2013.01); *C25D 5/12* (2013.01); *H05K 1/092* (2013.01); *H05K 1/117* (2013.01); *H05K 1/18* (2013.01); *H05K 3/185* (2013.01); *H05K 3/244* (2013.01); *C23C 18/1653* (2013.01); *H05K 2201/10159* (2013.01); *H05K 2201/10909* (2013.01); *H05K 2203/049* (2013.01); *H05K 2203/1572* (2013.01); *Y10T 29/49128* (2015.01)

(58) Field of Classification Search
  CPC . H05K 2201/0338; H05K 2201/10159; H05K 2201/0104; H05K 5/0269; H05K 2924/01078–2924/01079; G06K 19/077; H01L 2224/16
  USPC ....... 361/736–737, 767, 768, 772, 774, 777; 174/258–264
  See application file for complete search history.

(56) References Cited

FOREIGN PATENT DOCUMENTS

| KR | 10-2006-0006536 | 1/2006 |
| KR | 20060109365 A | 10/2006 |
| KR | 10-2010-0011818 A | 2/2010 |
| KR | 10-2011-0057729 A | 6/2011 |

OTHER PUBLICATIONS

International Search Report in International Application No. PCT/KR2012/010789, filed Dec. 12, 2012.

\* cited by examiner

| CONCENTRATION OF FIRST PILISH | 3ml/l | 5ml/l | 10ml/l | 7ml/l | 7ml/l | 7ml/l | 7ml/l |
|---|---|---|---|---|---|---|---|
| CONCENTRATION OF SECOND PILISH | 0 | 0 | 0 | 0.1ml/l | 0.3ml/l | 0.5ml/l | 0.7ml/l |
| THICKNESS OF WEAR (Pass < 0.1μm) | 0.12μm | 0.04μm | 0.05μm | 0.02μm | 0.03μm | 0.03μm | 0.04μm |
| BRIGHTNESS(min.) | 0.53 | 1.24 | 1.18 | 1.72 | 1.99 | 2.29 | 2.31 |
| IMAGE OF WEAR |  |  |  |  |  |  |  |

| CRYSTAL MODIFIER | 1ml/l | 1.6ml/l | 3ml/l | 1.6ml/l |
|---|---|---|---|---|
| POLISH | 0 | 0 | 0 | 1ml/l |
| THICKNESS OF WEAR | 0.1μm | 0.03μm | 0.04μm | 0.07μm |
| BRIGHTNESS(min.) | 1.81 | 1.99 | 1.94 | 1.93 |
| IMAGE OF WEAR |  |  |  |  |

| CRYSTAL MODIFIER | | 1 ml/l | 1.6 ml/l |
|---|---|---|---|
| TEMPERATURE | 20 °C | 166 Hv | 179 Hv |
| | 30 °C | 167 Hv | 184 Hv |
| | 40 °C | 161 Hv | 167 Hv |

|  |  | EXAMPLE 1 (NiPdAu) | EXAMPLE 2 (NiAu) |
|---|---|---|---|
| PLATING CONDITION | Ni (FIRST:SECOND) | 7ml/l : 0.3~0.5ml/l | 7ml/l : 0.3~0.5ml/l |
|  | Au | 1.6ml/l | 1.6ml/l |
| RESULT OF EVALUTION | Wire Pull (Spec. 0.7mil./ min 3gf) | 5.10 | 5.40 |
|  | BRIGHTNESS (Min.) | 2.29 | 2.21 |
|  | CORROSION RESISTANCE | Pass | Pass |
|  | WEAR RESISTANCE | Pass (THICKNESS OF WEAR : 0.03 μm) | Pass (THICKNESS OF WEAR : 0.19 μm) |

PRINTED CIRCUIT BOARD FOR MEMORY CARD

CROSS-REFERENCE TO RELATED APPLICATIONS

This application is the U.S. national stage application of International Patent Application No. PCT/KR2012/010789, filed Dec. 12, 2012, which claims priority to Korean Application No. 10-2011-0139628, filed Dec. 21, 2011, the disclosures of each of which are incorporated herein by reference in their entirety.

TECHNICAL FIELD

Embodiments of the present invention relate to a printed circuit board for a memory card and a method of manufacturing the same.

BACKGROUND ART

A memory card is used as a storage device in various electronic apparatuses such as a computer, a PDA, a digital camera, a camcorder and the like.

FIG. 1 is a view illustrating one surface of a conventional memory card.

Referring to FIG. 1, a memory card 10 includes a memory device mounted on a printed circuit board for the memory card. The memory device is a kind of semiconductor device. The memory device is covered by a resin molding unit. Furthermore, a terminal unit 11 is formed on one surface of the memory card to serve as a connector which is electrically connected to the electronic apparatuses in which the memory card 10 is used.

Meanwhile, the terminal unit 11 performs the function of the connector which is electrically connected to the electronic apparatuses of the outside.

When a defect such as a scratch or being stabbed is generated in the terminal unit 11, this has a large effect on a yield rate of the memory card 10.

FIG. 2a through 2h are cross-sectional views illustrating a conventional method of manufacturing a printed circuit board for a memory card in order of processes.

Referring to FIG. 2a, the printed circuit board for the memory card according to a conventional art includes a terminal unit 31 formed on a lower surface of the insulating layer 30, and a mounting unit 32 formed on an upper surface of the insulating layer 30. Even though the constituent element is not illustrated in FIG. 2a, the terminal unit 31 and the mounting unit 32 may be electrically connected to each other through via holes in which a conductive material is buried, thereby forming a circuit.

The terminal unit 31 provides the function of a connector so that the mounting unit 32 formed on the upper surface of the insulating layer 30 is electrically connected to external electronic apparatuses. The mounting unit 32 forms a circuit, mounts resistance, a capacitor and the like, or provides the function of a pad intended for an electrical connection with a memory device.

A photo-imagable solder resist 33 is formed at an upper side and a lower side of the insulating layer 30 so that each one part of the terminal unit 31 and the mounting unit 32 is exposed.

Referring to FIG. 2b, a first photosensitive dry film 34 is formed at the upper side and the lower side of the insulating layer 30, and the mounting unit 32 is exposed by performing an exposure process and a development process.

Referring to FIG. 2c, a soft gold layer 35 is formed on the mounting unit 32. It is advantageous in that the soft gold layer 35 enables gold wire bonding to be performed and has a good solder ability.

Furthermore, as illustrated in FIG. 2d, the first photosensitive dry film 34 is removed.

Referring to FIG. 2e, a second photosensitive dry film 36 is formed at the upper side and the lower side of the insulating layer 30, and the terminal unit 31 is exposed by performing the exposure process and the development process.

Referring to FIG. 2f, a hard gold layer 37 is plated with and formed on the terminal unit 31.

Since the hard gold layer 37 has high surface strength and high corrosiveness, the hard gold layer 37 is plated with a part which is frequently detached from other electronic apparatuses such as a connector of the memory card.

Referring to FIG. 2g, the second photosensitive dry film 36 is removed. Before the second photosensitive dry film 36 has been removed, to prevent the hard gold layer 37 from being damaged, a protective layer (not drawn) may be additionally formed.

If the processes as described above are all performed, the printed circuit board for the memory card may be manufactured. When the printed circuit board is manufactured, a memory semiconductor chip and a memory controller are attached thereto, thereby enabling it to be manufactured as the memory card.

That is, as illustrated in FIG. 2h, a memory device 40 is mounted on the photo-imagable solder resist 33 of the upper side of the insulating layer 30. The memory device 40 is electrically connected to the soft gold layer 35 through a wire 39. For example, the memory device 40 may be a memory chip or a memory controller.

Furthermore, that a molding member 41 is formed at the upper side of the insulating layer 30 in which the memory device 40 and the soft gold layer 35 are formed. The molding member 41 is formed by epoxy molding which is called an epoxy molding compound EMC so that circuit constituent components including the memory device 40 can be protected from external impacts or external environments.

However, with regard to the process of manufacturing the printed circuit board for the memory card according to the aforesaid conventional art, since properties required for the terminal unit 31 and the mounting unit 32 are different from each other, different gold plating processes from each other should be performed for the terminal unit 31 and the mounting unit 32. Thus, since various processes such as separate exposure and development processes and a process of peeling off a dry film should be carried out, it is disadvantageous in that economics and productivity is not good.

DISCLOSURE OF INVENTION

Technical Problem

An aspect of the present invention provides a printed circuit board for a memory card which is manufactured by a new surface treatment method capable of providing each desired physical property to a mounting unit and a terminal unit of the printed circuit board for a memory card, and a printed circuit board for a memory card manufactured by the method.

Another aspect of the present invention also provides a printed circuit board for a memory card and a method of manufacturing the same, wherein the memory card can satisfy both hardness and a wire bonding ability at the same time as reducing a thickness of a gold plated layer using a surface treatment method capable of satisfying all of a soldering property, a wire bonding ability and wear resistance.

A further aspect of the present invention also provides a printed circuit board for a memory card and a method of manufacturing the same, wherein the memory card can secure a plated layer capable of satisfying both the hardness and the wire bonding ability at the same time as reducing a thickness of gold required for surface treatment by reducing a thickness of the gold plated layer and can be applied to various substrates as well as general printed circuit boards.

Yet another aspect of the present invention also provides a printed circuit board for memory and a method of manufacturing the same which can carry out each process of plating a terminal unit and a mounting unit at one time rather than carrying out the each process separately by applying a surface treatment method to the field of a memory card, and so that a process cost can be reduced by simplifying processes of manufacturing the printed circuit board, and a cost of materials can be reduced according to a reduction in thickness of gold.

Solution to Problem

In order to solve the technical problems, according to an aspect of the present invention, there is provided a printed circuit board for a memory card, including: an insulating layer; a mounting unit which is formed on a first surface of the insulating layer and is electrically connected to a memory device; a terminal unit which is formed on a second surface of the insulating layer and is electrically connected to external electronic apparatuses; and metal layers formed at the mounting unit and the terminal unit and made of the same metal material.

According to another aspect of the present invention, there is provided a method of manufacturing a printed circuit board for a memory card, including: preparing an insulating layer having an upper surface and a lower surface on which each metal thin film is formed; forming a mounting unit on the upper surface of the insulating layer, and a terminal unit on the lower surface of the insulating layer, respectively by selectively removing each metal thin film formed on the upper surface and the lower surface of the insulating layer; selectively forming a photo-imagable solder resist, to which each surface of the mounting unit and the terminal unit is exposed, on the upper surface and lower surface of the insulating layer; and forming surface-treated metal layers by plating the surfaces of the mounting unit and the terminal unit with the same metal material.

Advantageous Effects of Invention

According to one exemplary embodiment of the present invention, the surface treatment method capable of satisfying all of a soldering property, a wire bonding ability and wear resistance can be provided.

According to one exemplary embodiment of the present invention, the surface treatment method capable of satisfying both the hardness and the wire bonding ability at the same time as reducing the thickness of the gold plated layer can be provided, and the plated layer capable of satisfying both the hardness and the wire bonding ability at the same time as reducing a thickness of gold required for the surface treatment can be secured by reducing a thickness of the gold plated layer, thereby providing a printed circuit board for a memory card which can be applied to various substrates as well as general printed circuit boards.

Also, according to one exemplary embodiment of the present invention, by applying the aforesaid surface treatment method to the field of a memory card, each process of plating the terminal unit and the mounting unit can be carried out at a time rather than being carried out, separately, and thus, the process of manufacturing the printed circuit board is simplified so that a process cost can be reduced, and the cost of materials can be reduced according to a reduction in thickness of gold.

BRIEF DESCRIPTION OF DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

MODE FOR THE INVENTION

Hereinafter, preferred embodiments of the present invention will be described in detail with reference to the accompanying drawings in such a manner that the present could be easily implemented by those having ordinary skill in the art to which the present invent pertains. The present invention may, however, be embodied in different forms and should not be construed as limited to the embodiments set forth herein.

When it is mentioned that a part such as a layer, a film, an area, a plate and the like is "above" other part, this includes a case in which the part is just above the other part as well as a case in which still another part is in their middle. On the contrary, when it is mentioned that a part is just above other part, this means that there is no still another part in their middle.

As a surface treatment method of a printed circuit board for a memory card, the present invention provides a printed circuit board for a memory card and a method of manufacturing the same, the printed circuit board, including: a nickel metal layer formed using a nickel plating solution to which a first polish including at least one of naphthalene, saccharin, sulfonic acid soda and sulfonamide, and a second polish including at least one of butanediol, gumirin and udylite are added; a palladium metal layer formed with a palladium plating solution; and a gold plated layer formed with a gold plating solution to which an inorganic crystal modifier and an organic additive are added.

Figure 1:
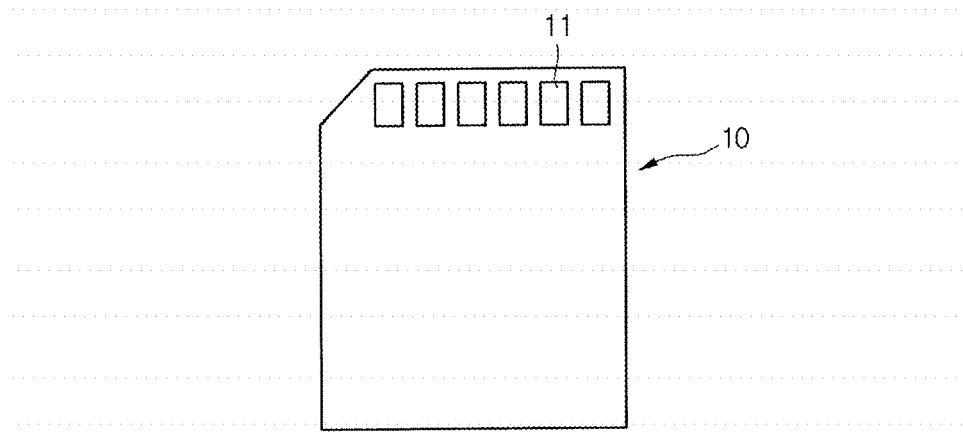
FIG. 1 is a view illustrating a memory card of a conventional art.
Figure 2A:
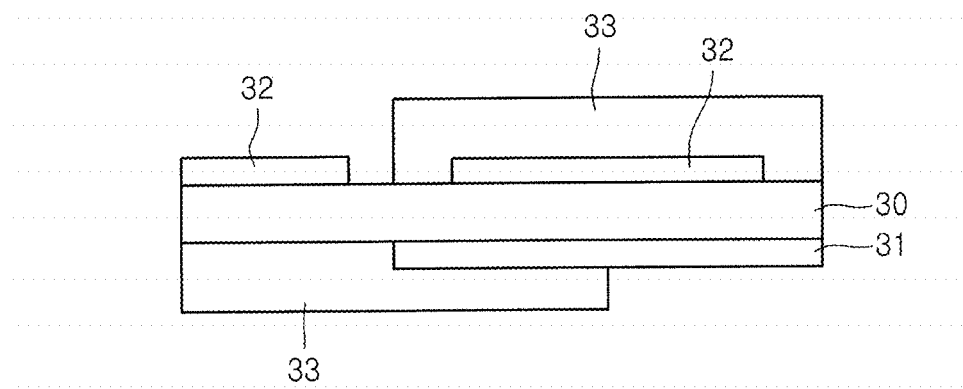
FIG. 2a through 2h are cross-sectional views for explaining a method of manufacturing a printed circuit board for a memory card and the memory card of the conventional art in order of processes.
Figure 2B:
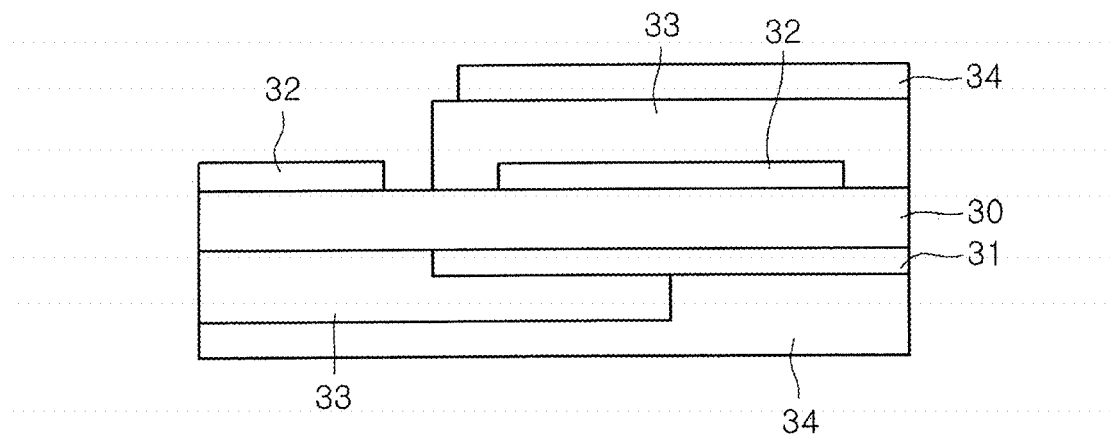
Figure 2C:
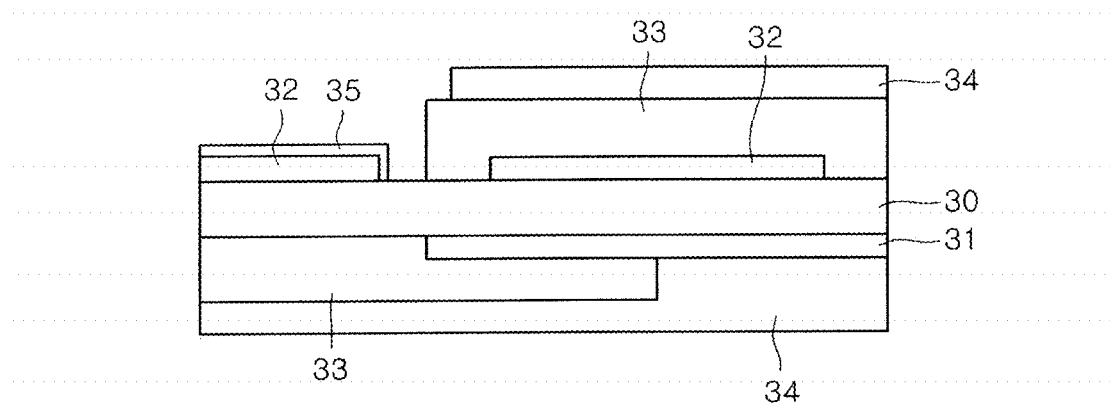
Figure 2D:
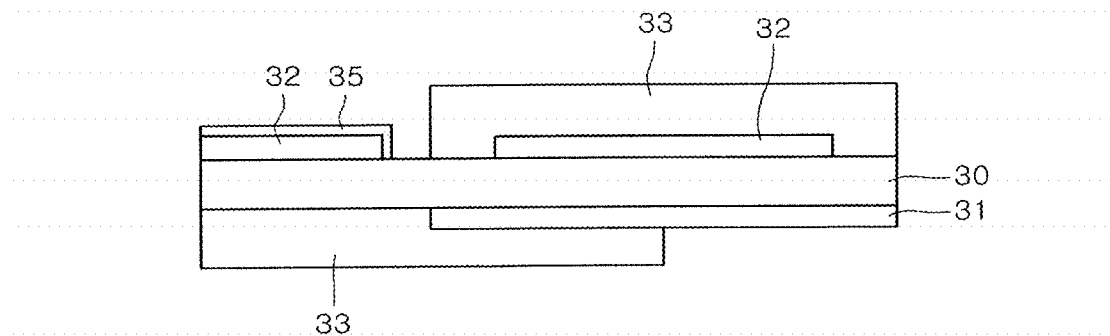
Figure 2E:
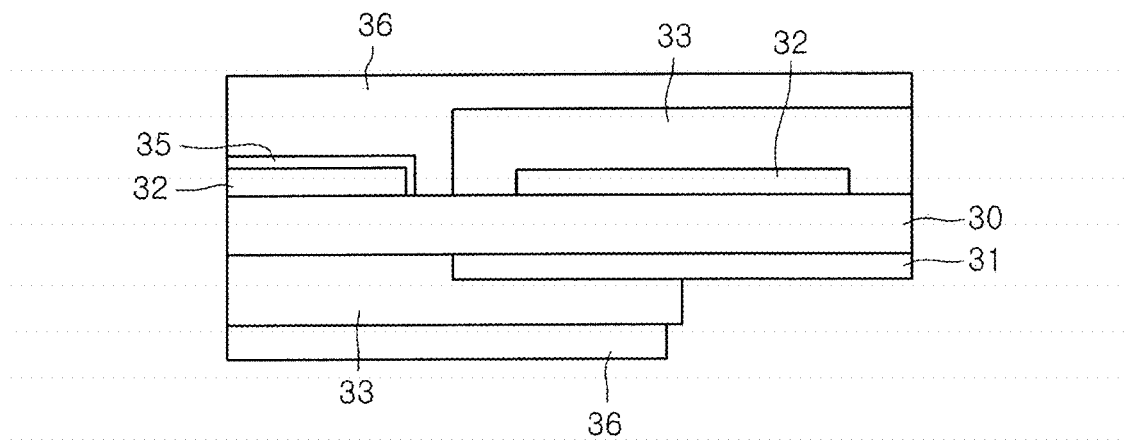
Figure 2F:
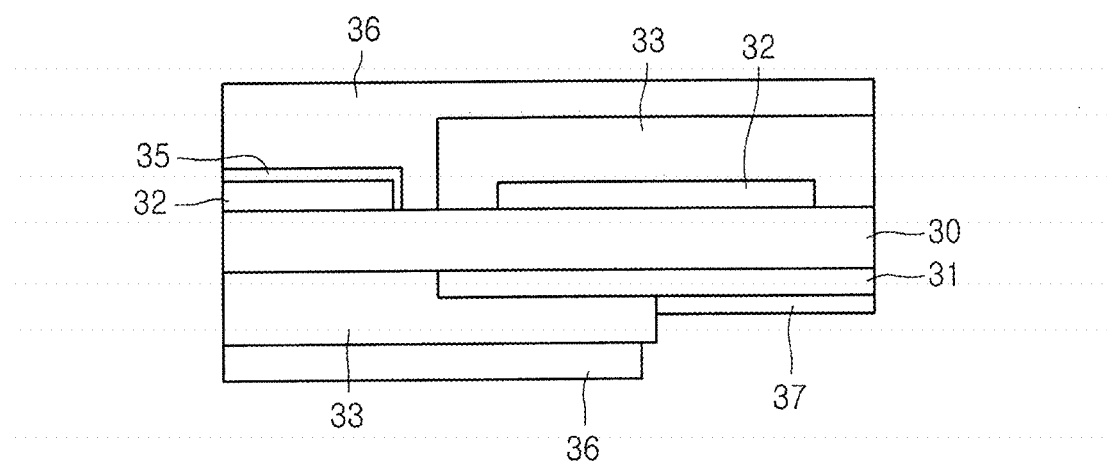
Figure 2G:
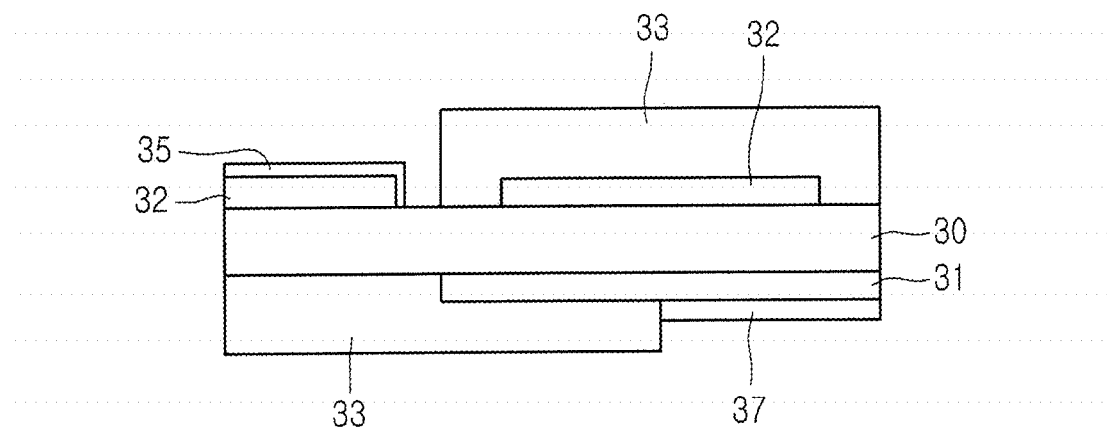
Figure 2H:
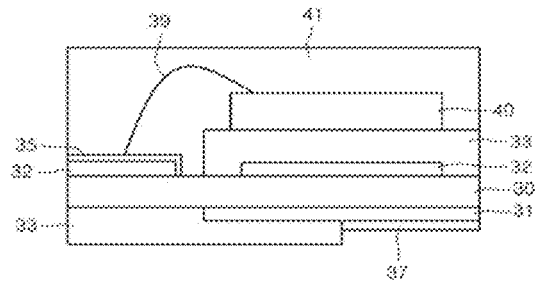
Figure 3:
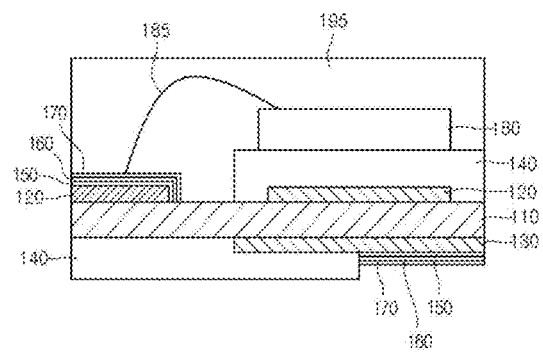
FIG. 3 is a view illustrating a printed circuit board for a memory card and a memory card including the printed circuit board according to an exemplary embodiment of the present invention.

FIG. 3 is a view illustrating a printed circuit board for a memory card and memory cards using the same according to one exemplary embodiment of the present invention.

Referring to FIG. 3, a printed circuit board 100 for a memory card according to one exemplary embodiment of the present invention includes: an insulating layer 110; a mounting unit 120 formed on an upper surface of the insulating layer 110; a terminal unit 130 formed on a lower surface of the insulating layer 110; a protective layer 140 formed on the insulating layer 110; a nickel metal layer 150 formed at the mounting unit 120 and the terminal unit 130; a palladium metal layer 160 formed on the nickel metal layer 150; and a gold plated layer 170 formed on the palladium metal layer 160. Here, the memory card includes the printed circuit board 100, a memory device 180, a wire 185 and a molding member 195.

The insulating layer 110 may be a support substrate of the printed circuit board in which a single circuit pattern is formed. Also, the insulating layer 110 may mean an insulating layer area in which a circuit pattern (not drawn) of is formed, in the printed circuit board having a plurality of laminated structures.

The insulating layer 110 may be a thermosetting or thermoplastic polymer substrate, a ceramic substrate, an organic-inorganic composite material based substrate, or a glass fiber-impregnated substrate. When the insulating layer 10 includes a polymer resin, it may include an epoxy-based insulating resin or the insulating layer 10 may also include a polyimide-based resin.

The mounting unit 120 is formed on the upper surface of the insulating layer 110, and the terminal unit 130 is formed on the lower surface of the insulating layer 110.

Hereinafter, it will be explained that the mounting unit 120 and the terminal unit 130 are formed on the upper surface and the lower surface of the insulating layer 110, respectively, but this is only one example. The mounting unit 120 and the terminal unit 130 may be all formed on one surface of the insulating layer 110.

For example, the mounting unit 120 may be formed at only any one area of the upper surface and the lower surface of the insulating layer 110, or may be formed on all of the upper surface and the lower surface of the insulating layer 110. Also, like the mounting unit 120, the terminal unit 130 may be formed at any one area or at all of the upper surface and the lower surface of the insulating layer 110. Also, on the contrary to the case of FIG. 3, the mounting unit 120 may be formed on the lower surface of the insulating layer 110, and the terminal unit 130 may be formed on the upper surface of the insulating layer 110.

The mounting unit 120 and the terminal unit 130 may be formed of a conductive material, and may be formed by selectively removing each metal thin film arranged on the upper surface and the lower surface of the insulating layer 110.

For example, the mounting unit 120 and the terminal unit 130 may be formed of an alloy including Cu, and roughness may be formed on their surfaces.

The mounting unit 120 is formed for mounting components, and the terminal unit 130 is formed to be electrically connected to external electronic apparatuses.

That is, the terminal unit 130 provides the function of a connector so that the mounting unit 120 formed on the upper surface of the insulating layer 100 is electrically connected to the external electronic apparatuses. The mounting unit 120 forms a circuit, mounts resistance and a capacitor and the like or provides the function of a metal pad for electrically connecting a memory device.

A photo-imagable solder resist (PSR) 140 is formed at an upper side and a lower side of the insulating layer 110 so that each one part of the mounting unit 120 and the terminal unit 130 is exposed.

The photo-imagable solder resist 140 is applied to the lower surface of the insulating layer 110 and one part of the terminal unit 130, and is also applied to the mounting unit 120 which forms the upper surface of the insulating layer 110 and the circuit. At this time, the photo-imagable solder resist 140 may not be applied to the mounting unit 120.

In the present exemplary embodiment, the same metal layers as each other are formed on the mounting unit 120 and the terminal unit 130.

At this time, each surface of the mounting unit 120 and the terminal unit 130 has different properties which are required according to the respective functions.

The mounting unit 120 should have a bonding ability of a certain level or more for mounting the memory device. The terminal unit 130 should satisfy a hardness of a certain level or more. That is, since the terminal unit 130 is a part which is exposed to the outside, the terminal unit 130 should have a brightness of a certain level or more and sufficient wear resistance.

Thus, as illustrated in FIG. 2a through 2h, in the past, different surface treatment methods from each other were applied to the mounting unit and the terminal unit, respectively.

However, in the present exemplary embodiment, the same surface treatment method is applied to the mounting unit 120 and the terminal unit 130, respectively so that a wire bonding ability which the mounting unit 120 should have, and brightness and wear resistance which the terminal unit 130 should have can be all satisfied. Also, in the past, a plurality of plating processes should be carried out at the upper surface and the lower surface on the basis of the insulating layer 10, respectively. However, in the present exemplary embodiment, each same metal layer is formed at the upper surface and the lower surface of the insulating layer 110 at a time.

Explaining the surface-treated metal layers more specifically the nickel metal layer 150 is first formed on the mounting unit 120 and the terminal unit 130.

The nickel metal layer 150 is formed using the nickel plating solution including Ni, and roughness may be formed on its surface.

The nickel metal layer 150 may be formed of only Ni, or may be also formed of an alloy of P (phosphorus), B (boron), W (tungsten) or Co (cobalt), including Ni (nickel) as a main component. The nickel metal layer 150 has a thickness of 2 to 10 μm, preferably, 3 to 5 μm.

At least one polish is added to the nickel plating solution used for forming the nickel metal layer 150. The polish is added into the nickel plating solution to adjust brightness of the nickel metal layer 150.

The polish includes: a first polish including at least one of naphthalene, saccharin, sulfonic acid soda and sulfonamide; and a second polish including at least one of butanediol, gumirin and udylite. Since the brightness and roughness are in inverse proportion to each other, roughness may be changed by adjusting the brightness.

The first polish is added into the nickel plating solution in a concentration ranging from 5 to 10 ml/l, and the second polish is added into the nickel plating solution in a concentration ranging from 0.3 to 0.5 ml/l. This is because the first polish and the second polish have an effect on the wear resistance and brightness of the nickel metal layer 150.

That is, to obtain a brightness of more than 1.8, the first polish and the second polish are all added into the nickel plating solution. At this time, when a concentration of the first polish in the nickel plating solution increases, brightness increases, and wear resistance becomes good due to a thin thickness of wear. Also, when a concentration of the second polish increases, this has a very small effect on the brightness, but has no large effect on the wear resistance.

At this time, in a case where each concentration of the first polish and the second polish increases in a range which satisfies the above condition of the brightness, it would be difficult to manage the plating solution, and it may have an effect on the brightness and the wear resistance. Accordingly, in consideration of stability of the nickel plating solution, it would be preferable that the first polish is added into a concentration ranging from 5 to 10 ml/l, and the second polish is added into a concentration ranging from 0.3 to 0.5 ml/l.

The palladium metal layer 160 is formed on the nickel metal layer 150.

The palladium metal layer 160 may formed using a palladium plating solution including Pd, and a predetermined roughness may be formed on its surface.

In the palladium metal layer 160, only palladium may be included in the palladium plating solution. According to implementation, at least one metal of cobalt (Co), zinc (Zn), nickel (Ni) and an inorganic substance may be further included therein.

The aforesaid palladium metal layer 160 is formed to secure the hardness of a certain level or more.

It would be preferable that the palladium metal layer 160 is formed of an alloy of palladium and nickel. The palladium metal layer 160 is formed in a thickness of 0.05 to 0.5 μm, preferably, 0.1 to 0.2 μm.

The gold plated layer 170 is formed on the palladium metal layer 160.

The gold plated layer 170 is formed of a gold plating solution. To improve the hardness and adjust the roughness, an inorganic crystal modifier and an organic additive are added into the gold plating solution.

The gold plating solution is intended to satisfy a solder bonding ability, a wire bonding ability and the hardness of a certain level or more. Each concentration of the added inorganic crystal modifier and organic additive is adjusted so as to satisfy the hardness which is required for the gold plated layer 170.

The additive added into the gold plating solution determines a crystal shape of the plated layer, and in particular, the inorganic crystal modifier has a large effect on the crystal shape of the plated layer.

Accordingly, the inorganic crystal modifier may be added into the gold plating solution in a concentration ranging from 1.5 to 2 ml/l. When the inorganic crystal modifier is added in the range as described above, a structure of the gold plated layer 170 becomes finer than that of the gold plated layer 170 when the inorganic crystal modifier is added into a concentration in the range of 1 ml/l, thereby satisfying the hardness required for the gold plated layer 170.

Also, roughness may be changed by additionally adding an additive into the gold plating solution. In this case, grains trend to become fine and an amorphous shape due to the additional additive. Thus, it would be preferable that the additional additive, for example, the polish, is not added into the gold plating solution.

Also, as a plating temperature for forming the gold plated layer 170 becomes gradually lower, the hardness becomes higher, and in particular, since the best hardness property results from a plating temperature ranging from 30 to 40° C., the gold plated layer 170 may be formed with the gold plating solution at the plating temperature atmosphere in the range of 30 to 40° C.

The aforesaid gold plated layer 170 formed of the gold plating solution is formed in a thickness of 0.05 to 0.5 μm, preferably, 0.1 to 0.2 μm.

A metal pattern including the nickel metal layer 150, the palladium metal layer 160, and the gold plated layer 170 may secure a solder bonding ability, a wire bonding ability and wear resistance by improving the hardness property through a variation in component of the gold plating solution for forming the gold plated layer 170.

The plating solution for forming the aforesaid metal layers (metal patterns) may use acidic or neutral types to prevent the plating solution and the substrate from being damaged due to elution of the photo-imagable solder resist and the dry film.

According to the present exemplary embodiment, the printed circuit board for the memory card may be provided with a surface treatment method capable of satisfying both the hardness and the wire bonding ability at the same time as reducing the thickness of the gold plated layer using at least one of the nickel metal layer and the palladium metal layer and may be efficiently produced using the surface treatment method.

Also, according to the present exemplary embodiment, by applying the gold plated layer to the field of the memory card, each process of plating the terminal unit and the mounting unit may be not separately performed, but may be performed at one time. Thus, as the manufacturing process of the printed circuit board is simplified, a process cost can be reduced. Furthermore, as the amount of gold consumed is reduced, the cost of materials can be reduced.

Hereinafter, a method of manufacturing the printed circuit board for the memory card of FIG. 3 will be explained with reference to FIG. 4 through FIG. 11.

Figure 4:
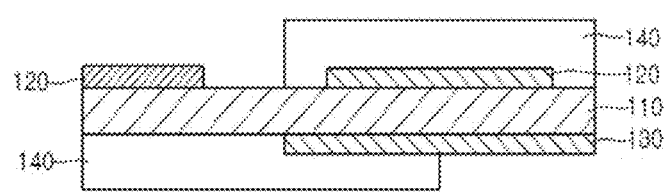
FIG. 4 through FIG. 11 are views for explaining the printed circuit board for the memory card according to the exemplary embodiment of the present invention in order of processes.

First, referring to FIG. 4, the mounting unit 120 is formed on the upper surface of the insulating layer 110, and the terminal unit 130 is formed on the lower surface of the insulating layer 110. Even though the constitutive element is not illustrated, the mounting unit 120 and the mounting unit 130 are electrically connected to each other through via holes, thereby forming a circuit.

The insulating layer 110 may be made of a material having an insulating property, and the mounting unit 120 and the terminal unit 130 may be formed by selectively removing each metal thin film arranged on the upper surface and the lower surface of the insulating layer 110.

For example, the insulating layer 110 is prepared, and a conductive layer (not drawn) is laminated on the insulating layer 110. At this time, a laminated structure of the insulating layer 110 and the conductive layer may be a normal copper clad laminate (CCL). Also, the conductive layer may be formed by applying electroless plating onto the insulating layer 110. When the conductive layer is formed by electroless plating, roughness is provided onto the upper surface of the insulating layer 110 so that the plating may be smoothly performed.

The terminal unit 130 formed on the lower surface of the insulating layer 110 provides the function of a connector so that the mounting unit 120 formed on the upper surface of the insulating layer 100 is electrically connected to the external electronic apparatuses. The mounting unit 120 forms a circuit, mounts resistance and a capacitor and the like or provides the function of a metal pad for electrically connecting a memory device.

The photo-imagable solder resist (PSR) 140 is formed at an upper side and a lower side of the insulating layer 110 so that each one part of the mounting unit 120 and the terminal unit 130 is exposed.

The photo-imagable solder resist 140 is applied to the lower surface of the insulating layer 110 and one part of the terminal unit 130, and is also applied to the mounting unit 120 which forms the upper surface of the insulating layer 110 and the circuit. At this time, the photo-imagable solder resist 140 may not be applied to the mounting unit 120 for providing the function of the metal pad.

Figure 5:
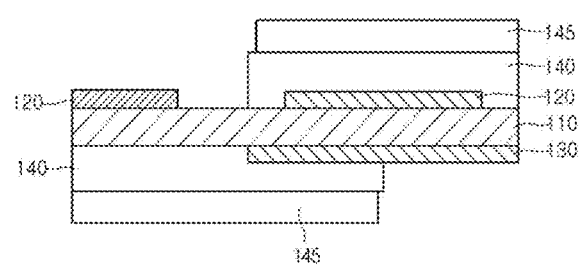

Next, referring to FIG. 5, a first photosensitive dry film 145 is formed at the upper side and the lower side of the insulating layer 110, and each surface of the mounting unit 120 for providing the function of the metal pad, and the terminal unit 130 connected to the external apparatuses is exposed by performing an exposure process and a development process.

That is, the photosensitive dry film 145 is formed on the upper surface and the lower surface of the insulating layer 110 so that one part of each of the mounting unit 120 and the terminal unit 130 is exposed.

Figure 6:
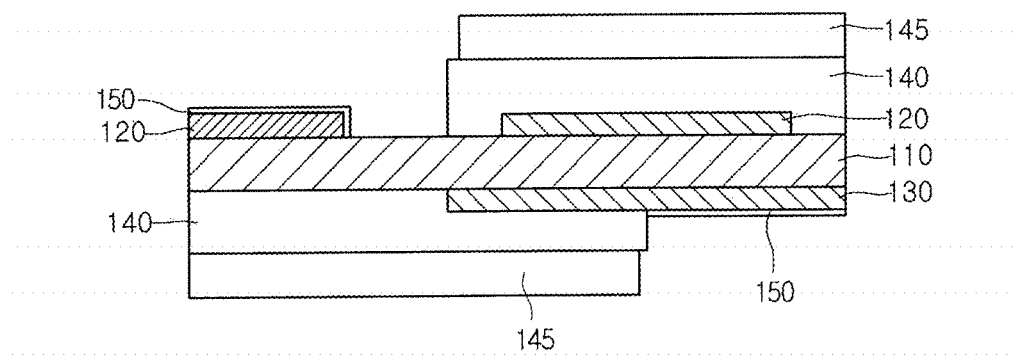

Next, referring to FIG. 6, the nickel metal layer 150 is formed on the mounting unit 120 for providing the function of the metal pad, and the terminal unit 130.

The nickel metal layer 150 is formed by plating the mounting unit 120 and the terminal unit 130 with the plating solution including Ni.

At this time, roughness is provided on each surface of the mounting unit 120 and the terminal unit 130 so that the formation of the nickel metal layer 150 may be easily realized.

The nickel metal layer 150 may be formed of only Ni, or may be also formed of an alloy of P (phosphorus), B (boron), W (tungsten), or Co (cobalt), including Ni (nickel) as a main component. The nickel metal layer 150 has a thickness of 2 to 10 μm, preferably, 3 to 5 μm.

At least one polish is added to the nickel plating solution used for forming the nickel metal layer 150. The polish is added into the nickel plating solution to adjust a brightness of the nickel metal layer 150.

The polish includes: a first polish including at least one of naphthalene, saccharin, sulfonic acid soda and sulfonamide; and a second polish including at least one of butanediol, gumirin and udylite. At this time, since the brightness and roughness are in inverse proportion to each other, the roughness may be changed by adjusting the brightness.

The first polish is added into the nickel plating solution in a concentration ranging from 5 to 10 ml/l, and the second polish is added into the nickel plating solution in a concentration ranging from 0.3 to 0.5 ml/l. This is because the first polish and the second polish have an effect on wear resistance and brightness of the nickel metal layer 150.

That is, to obtain a brightness of more than 1.8, the first polish and the second polish are all added into the nickel plating solution. At this time, when a concentration of the first polish in the nickel plating solution increases, the brightness also increases, and wear resistance becomes good due to a thin thickness of wear. Also, when a concentration of the second polish increases, this has a very small effect on the brightness, and has no large effect on the wear resistance.

In other words, in the case where each concentration of the first polish and the second polish increases in a range which satisfies the above condition of the brightness, it would be difficult to manage the plating solution. Furthermore, since it has an effect on the brightness and the wear resistance, in consideration of stability of the solution, it would be preferable that the first polish is added into a concentration ranging from 5 to 10 ml/l, and the second polish is added into a concentration ranging from 0.3 to 0.5 ml/l.

In FIG. 6, it is illustrated that the nickel metal layer 150 surrounds the upper surface and the side of the mounting unit 120 and is formed on only the surface of the terminal unit 130. However, this is only one example. A shape of forming the nickel metal layer 140 may be modified depending on exemplary embodiments.

Figure 7:
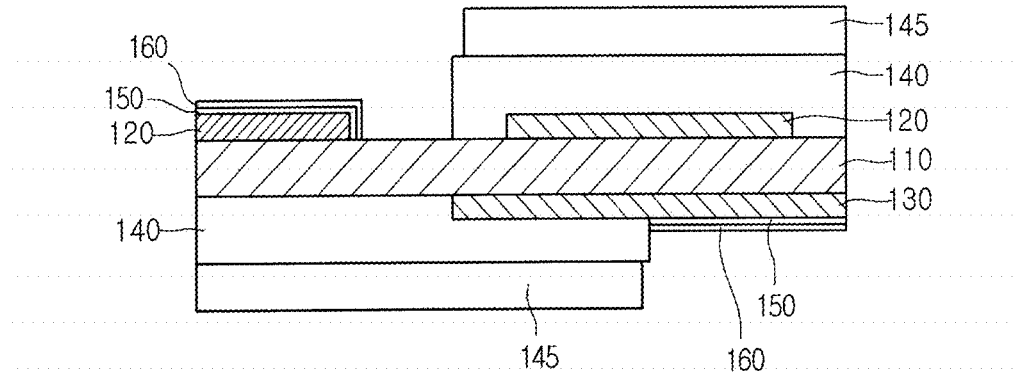

Next, as illustrated in FIG. 7, the palladium metal layer 160 is formed on the nickel metal layer 150.

The palladium metal layer 160 may be formed by coating of a palladium solution. Only palladium may be included in the palladium plating solution, or at least one metal of cobalt (Co), zinc (Zn), nickel (Ni) and an inorganic substance may be further included therein.

The aforesaid palladium metal layer 160 is formed to secure a hardness of a certain level or more.

It would be preferable that the palladium metal layer 160 is formed of an alloy of palladium and nickel. The palladium metal layer 160 is formed in a thickness of 0.05 to 0.5 μm, preferably, 0.1 to 0.2 μm.

Figure 8:
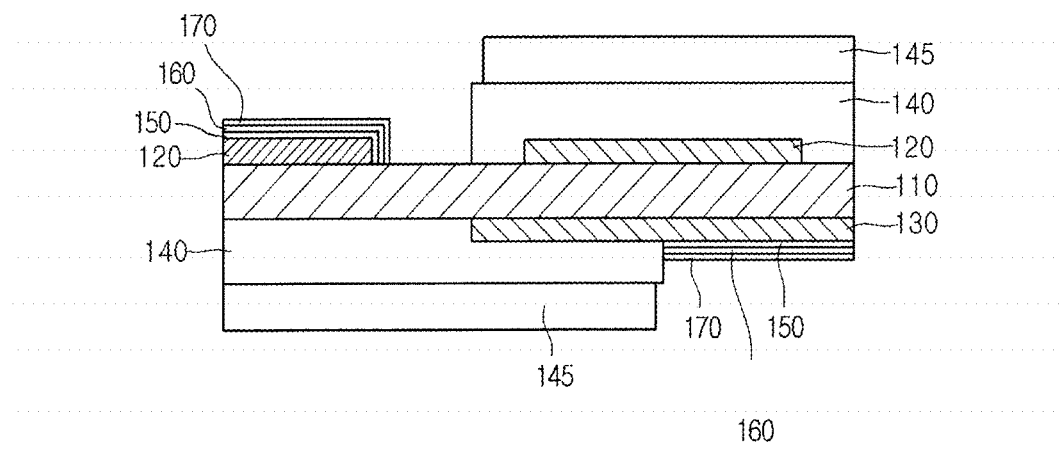

Next, as illustrated in FIG. 8, the gold plated layer 170 is formed on the palladium metal layer 160.

The gold plated layer 170 is formed of a gold plating solution. To improve the hardness and adjust the roughness, an inorganic crystal modifier and an organic additive are added into the gold plating solution.

The gold plating solution is intended to satisfy a solder bonding ability, a wire bonding ability and the hardness of a certain level or more. Each concentration of the added inorganic crystal modifier and organic additive is adjusted so as to effectively satisfy the hardness which is required for the gold plated layer 170.

The additive added into the gold plating solution determines a crystal shape of the plated layer, and in particular, the inorganic crystal modifier has a large effect on the crystal shape of the plated layer.

Accordingly, the inorganic crystal modifier may be added into the gold plating solution and in a concentration ranging from 1.5 to 2 ml/l. As the inorganic crystal modifier is added in the range as described above, a structure of the gold plated layer 170 becomes finer than that of the gold plated layer 170 when the inorganic crystal modifier is added into a concentration in the range of 1 ml/l, thereby effectively satisfying the hardness required for the gold plated layer 170.

Also, roughness may be changed by separately adding an additional additive into the gold plating solution. In this case, grains trend to become fine and an amorphous shape due to the additional additive, and thus, it would be preferable that the additional additive, for example, the polish, is not added into the gold plating solution.

Also, as the plating temperature for forming the gold plated layer 170 becomes gradually lower, the hardness becomes higher. Particularly, since the plating temperature satisfies an optimum hardness property within a range of 30 to 40° C., it would be preferable that the gold plated layer 170 is formed of the gold plating solution as described above at the plating temperature atmosphere within the range of 30 to 40° C.

Also, the gold plated layer 170 formed of the gold plating solution as described above is formed in a thickness of 0.05 to 0.5 μm, preferably, 0.1 to 0.2 μm.

As described above, a metal pattern including the nickel metal layer 150, the palladium metal layer 160, and the gold plated layer 170 may secure a solder bonding ability, a wire bonding ability and wear resistance by improving the characteristic of hardness through a variation in component of the gold plating solution for forming the gold plated layer 170.

Figure 9:
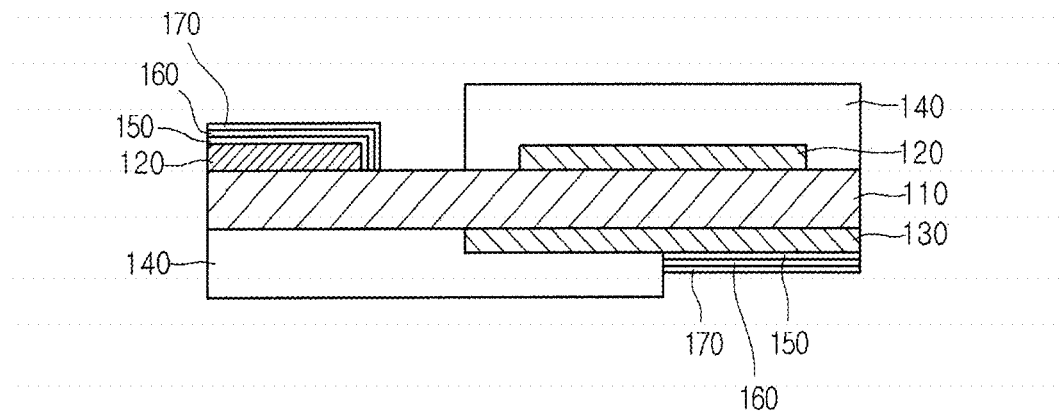

Next, as illustrated in FIG. 9, the photosensitive dry film 145 is removed from the photo-imagable solder resist 140.

Figure 10:
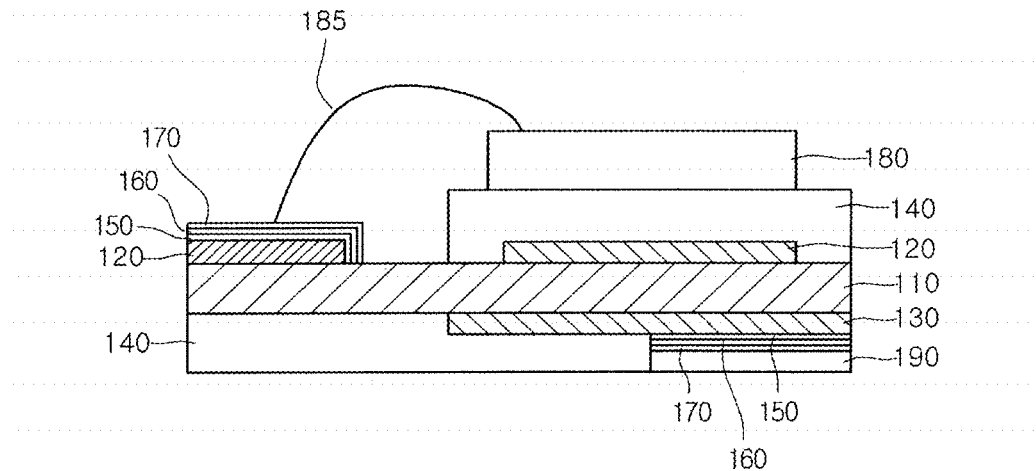

Furthermore, as illustrated in FIG. 10, a memory device 180 is bonded to the photo-imagable solder resist 140, and the bonded memory device 180 and the mounting unit 120, more preferably, the gold plated layer 170 formed on the mounting unit 120, are electrically connected through a wire 185.

During the process for mounting the memory device 190, a defect such as a scratch or being stabbed may be generated on the gold plated layer 170 formed on the terminal unit 130, Thus, to prevent the gold plated layer 170 from being damaged, the protective layer 190 may be formed on the gold plated layer 170 formed on the terminal unit 130.

The protective layer 190 may be made of a metal or nonmetal material. The protective layer 190 may be formed by an electro-plating method or an electro-deposition method.

For example, when the protective layer 190 is formed by the electro-plating method, the protective layer 190 may be formed of any one of Cu, Pb, Sn and Ni. Also, for example, when the protective layer 190 is formed by the electro-deposition method, the protective layer 190 may be formed as a resist layer.

It would be preferable that the protective layer 190 is formed before the photosensitive dry film 145 is removed.

When the main processes for manufacturing the printed circuit board for the memory card are completed, the protective layer 190 is removed. The protective layer 190 may be removed using a peeling agent for the protective layer only according to a material which is used. At this time, the gold plated layer 170 is not damaged thanks to the protective layer 190. Furthermore, copper is used in the protective layer 190, the protective layer 190 may be removed by alkali etching.

Next, after the protective layer 190 and the photosensitive dry film 145 have been removed, the memory device 180 is installed on the photo-imagable solder resist 140 of the upper side of the insulating layer 100. Then, the memory device 180 is electrically connected to the gold plated layer 170 formed on the mounting unit 120 through the wire 185. The memory device 180 may be a memory semiconductor chip and a memory controller.

Even though the constituent element is not illustrated in detail in FIG. 10, manual devices such as a resistor or a capacitor may be installed on the gold plated layer 170 of the mounting unit 120.

Figure 11:
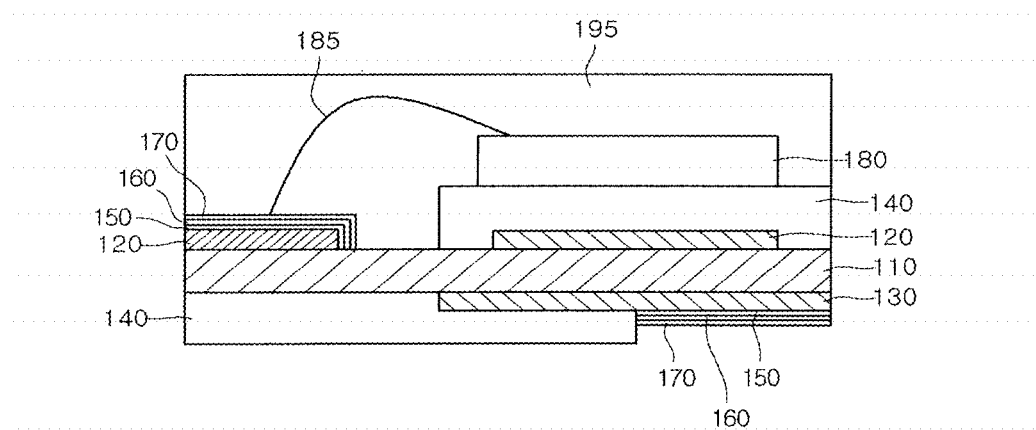

Next, referring to FIG. 11, a molding member 195 is formed at the upper side of the insulating layer 110 in which the memory device 180 and the gold plated layer 170 of the mounting unit 120 are disposed. The molding member 195 is formed by epoxy molding which is called an epoxy molding compound (EMC) so that circuit constituent components including the memory device 180 can be protected from external impacts or external environments.

Figure 12:
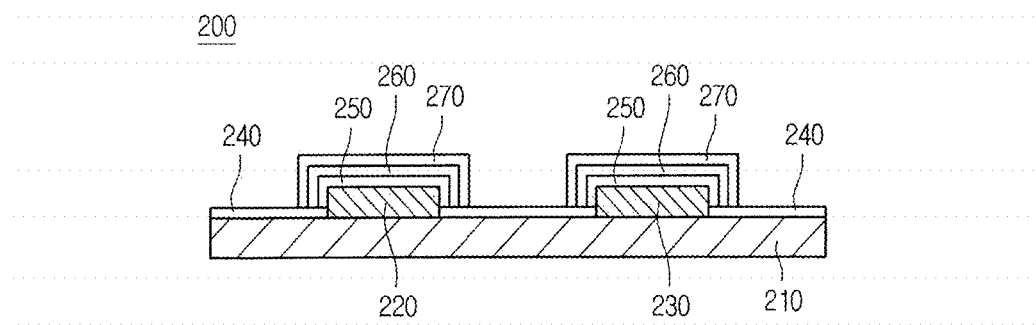
FIG. 12 is a view illustrating a printed circuit board for a memory card according to other exemplary embodiment of the present invention.

FIG. 12 is a cross-sectional view illustrating a printed circuit board for a memory card according to another exemplary embodiment of the present invention.

Referring to FIG. 12, a printed circuit board 200 for a memory card includes: an insulating layer 210; a mounting unit 220 formed on an upper surface of the insulating layer 210; a terminal unit 230 formed on a upper surface of the insulating layer 210; a photo-imagable solder resist 240 which is formed on the insulating layer 210, and to which the mounting unit and the terminal unit are exposed; a nickel metal layer 250 formed on the mounting unit 220 and the terminal unit 230; a palladium metal layer 260 formed on the nickel layer 250; and a gold plated layer 270 formed on the palladium metal layer 260.

That is, the printed circuit board for the memory card 200 of FIG. 12 is substantially identical with the printed circuit board for the memory card, and the method of manufacturing the same, as illustrated in FIG. 3 through FIG. 11. A difference is only that along with the mounting unit 220, the terminal unit 230 is formed on the upper surface rather than the lower surface of the insulating layer 210.

In other words, FIG. 12 illustrates the printed circuit board for the memory card of the present exemplary embodiment having a shape of the general printed circuit board. It can be seen that the characteristics of the printed circuit board for the memory card and the method of manufacturing the same as illustrated in FIG. 3 through FIG. 11 may be applied to the general printed circuit board.

Since the nickel metal layer, the palladium metal layer and the gold plated layer 150, 160, 170, 250, 260, 270 according to the present exemplary embodiment have the wire bonding ability, brightness and wear resistance of a certain level or more, they may be formed on each surface of the mounting unit and the terminal unit of the printed circuit board for which different properties from each other are required.

Also, the nickel metal layer, the palladium metal layer and the gold plated layer 250, 260, 270 may be also formed on the wirings for which the wire bonding ability is required, and according to implementation, they may be also formed on the wirings for which the brightness and the wear resistance are required.

Meanwhile, unlike the case as explained above, the memory card, and the printed circuit board for the memory card according to another exemplary embodiment of the present invention may be implemented to include only two metal layers as metal patterns coated on the mounting unit and the terminal of the printed circuit board.

That is, in the embodiment previously described based on FIGS. 3 to 11, the metal layer of a three layered structure including the nickel metal layer, the palladium metal layer and the gold plating layer is disclosed, but differently from this, the metal layer may include only the nickel metal layer and the gold plating layer.

Figure 13:
FIG. 13 is the test results of wear resistance according to each plating condition of a nickel metal layer adopted in the printed circuit board for the memory card according to the exemplary embodiment of the present invention.
Figure 13:
Figure 13:
Figure 13:
Figure 13:
Figure 13:
Figure 13:

FIG. 13 shows the test results of wear resistance according to each plating condition of a nickel metal layer 150 of the printed circuit board for the memory card according to still another exemplary embodiment of the present invention.

Referring to FIG. 13, in the method of manufacturing the printed circuit board for the memory card according to the present exemplary embodiment, in order to obtain a brightness of more than 1.8, the first polish and the second polish are all added into the nickel plating solution. When a concentration of the first polish in the nickel plating solution increases, brightness becomes high, and wear resistance becomes good due to a thin thickness of wear. Also, when a concentration of the second polish increases, this has a very small effect on the brightness, but has no large effect on the wear resistance.

In other words, when each concentration of the first polish and the second polish increases in a range which satisfies a condition of the brightness, it would be difficult to manage the plating solution, and it has an effect on the brightness and the wear resistance. Accordingly, in the present exemplary embodiment, in consideration of stability of the nickel plating solution, the first polish is added into a concentration ranging from 5 to 10 ml/l, and the second polish is added into a concentration ranging from 0.3 to 0.5 ml/l.

Figure 14:
FIG. 14 is the test results of wear resistance according to each plating condition of a gold metal layer adopted in the printed circuit board for the memory card according to the exemplary embodiment of the present invention.
Figure 14:
Figure 14:
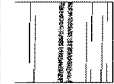
Figure 14:
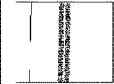
Figures 15, 16:
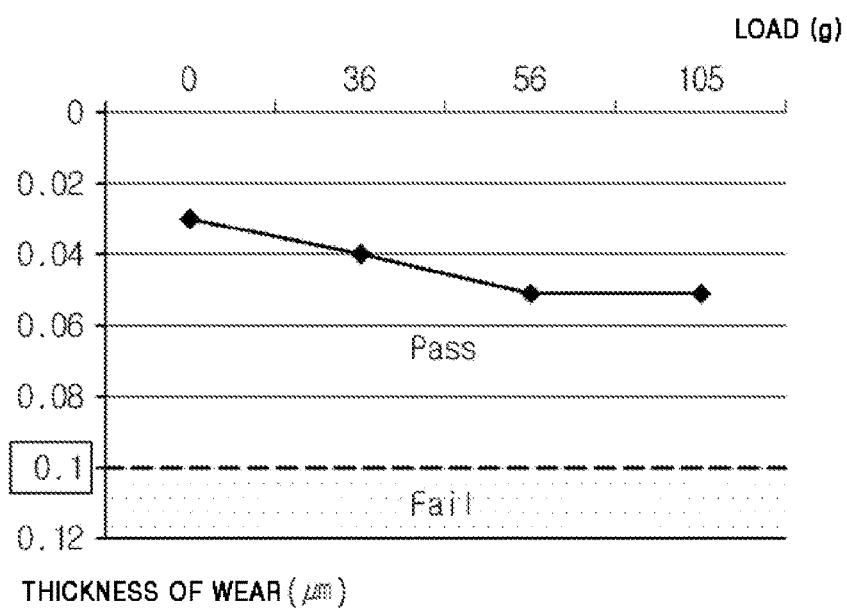
FIG. 15 is the test results of hardness according to each plating condition of a gold plated layer adopted in the printed circuit board for the memory card according to the exemplary embodiment of the present invention.
FIG. 16 is the test results of wear resistance according to each load of a coated metal layer of the printed circuit board for the memory card according to an exemplary embodiment of the present invention.

FIG. 14 is the test results of wear resistance according to each plating condition of a gold metal layer 170 of the printed circuit board for the memory card according to still another exemplary embodiment of the present invention; and FIG. 15 is the test results of hardness according to each plating condition.

Referring to FIG. 14 and FIG. 15, in a case where a plating condition of the nickel plated layer 150 is fixed, and as the test result of wear resistance according to the plating condition of the gold metal layer 170, the inorganic crystal modifier has the concentration of a certain level or more, the wear resistance is good. Furthermore, in a case where the polish is added, the brightness hardly changes, but since a thickness of wear is high, the wear resistance is reduced, so it would be preferable that the polish is not added.

As described above, the inorganic crystal modifier which is included in the gold plating solution for the gold plated layer 170 is suitable when it is in a range of 1.5~2 ml/l. In consideration of the fact that the hardness is changed depending to a plating temperature, when the inorganic crystal modifier is added in the range of 1.5~2 ml/l, the temperature atmosphere of the plating process may be controlled in the range of 30 to 40° C.

FIG. 16 is the test results of wear resistance according to each load of the metal layer (coated metal layer) of the printed circuit board for the memory card according to yet other exemplary embodiment of the present invention.

Referring to FIG. 16, in a case where the nickel metal layer, the palladium metal layer and the gold plated layer are formed at the mounting unit and the terminal unit of the printed circuit board for the memory card, the thicknesses of wear were similar to each other regardless loads in a load of less than 100 g except for the weight of a jig, and they showed the good wear resistance.

Figures 17, 18:
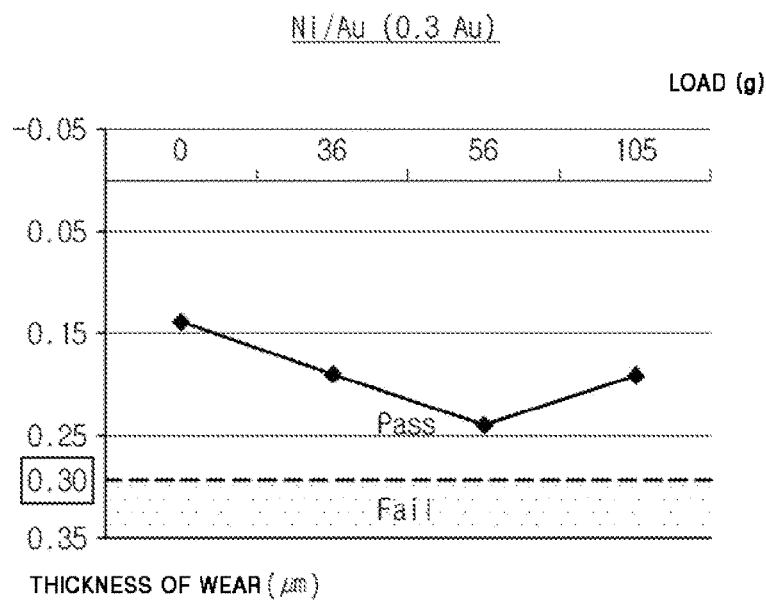
FIG. 17 is the test results of wear resistance according to each load of a coated metal layer of the printed circuit board for the memory card according to other exemplary embodiment of the present invention.
FIG. 18 is a view which evaluates each property according to the structure of the coated metal layer of the printed circuit board for the memory according to the exemplary embodiment of the present invention.

FIG. 17 is the test results of wear resistance according to each load of the printed circuit board for the memory card according to further exemplary embodiment of the present invention.

Referring to FIG. 17, in a case where the palladium metal layer is not formed, and the nickel metal layer and the gold plated layer are only formed, they also shown the good wear resistance regardless loads.

FIG. 18 is a view showing each property evaluated according to the structure of a metal layer of the printed circuit board for the memory card according to still further exemplary embodiment of the present invention.

Referring to FIG. 18, the structure of the metal layers including the nickel metal layer, the palladium metal layer and the gold plated layer has an improved hardness compared to the structure of the metal layer including only the nickel metal and the gold plated layer, so the thickness of wear becomes small. Thus, it can be confirmed that the structure of the metal layer further including the palladium metal is more suitable to improve the wear resistance.

According to the present exemplary embodiment of the invention, the surface treatment method capable of satisfying all of a soldering property, a wire bonding ability and wear resistance may be provided.

According to the present exemplary embodiment, the printed circuit board for the memory card capable of satisfying both hardness and the wire bonding ability at the same time as reducing a thickness of a gold plated layer using the aforesaid surface treatment method can be provided.

Thus, the thickness of the gold plated player may be reduced. That is, a gold plated layer capable of satisfying both the hardness and the wire bonding ability at the same time as reducing a thickness of gold which is required for surface treatment can be secured. Thus, the plated layer can be applied to various substrates as well as general printed circuit boards.

Also, by applying the surface treatment method to the field of a memory card, each plating process for surface treatment of the terminal unit and the mounting unit of the printed circuit board can be carried out at one time rather than being carried out, separately. Thus, the process of manufacturing the printed circuit board is simplified, so a process cost can be reduced. Furthermore, as the thickness of gold is reduced, the cost of materials can be reduced.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A printed circuit board for a memory card, comprising:
an insulating layer;
a mounting unit disposed on a first surface of the insulating layer and electrically connected to a memory device;
a terminal unit disposed on a second surface opposite to the first surface of the insulating layer and electrically connected to external electronic apparatuses;
a first metal layer disposed on the mounting unit; and
a second metal layer disposed on the terminal unit, wherein properties of the first metal layer are same as properties of the second metal layer;

wherein the properties comprise a bonding property, a glossiness property, and a wear resistance property;

wherein each of the first and second metal layers comprises:

a nickel metal layer formed by a nickel plating solution including Ni, a gold plated layer formed by a gold plating solution including Au, and a palladium metal layer formed between the nickel metal layer and the gold plated layer;

wherein the nickel plating solution comprises:

a first polish having a content ranging from 5 to 10 ml/l of a total volume of the nickel plating solution, and a second polish having a content ranging from 0.3 to 0.5 ml/l of a total volume of the nickel plating solution; and wherein the gold plating solution comprises an inorganic crystal modifier having a content ranging from 1.5 to 2.0 ml/l and an organic additive of a total volume of the gold plating solution.

2. The printed circuit board of claim 1, wherein the first polish includes at least one of saccharin, sulfonic acid soda and sulfonamide; and wherein the second polish includes at least one of butanediol, coumarin and udylite.

3. The printed circuit board of claim 1, wherein the gold plated layer is plated and formed with the gold plating solution at a temperature atmosphere ranging from 30° C. to 40° C.

4. The printed circuit board of claim 1, wherein the nickel metal layer is formed with a thickness ranging from 5 to 8 µm, the gold plated layer is formed with a thickness ranging from 0.01 to 0.6 µm, and the palladium metal layer is formed with a thickness ranging from 0.01 to 0.5 µm.

5. The printed circuit board of claim 1, wherein the gold plated layer is a gold alloy layer including at least one metal of silver (Ag), copper (Cu), palladium (Pd), zinc (Zn), cobalt (Co), and an inorganic substance, and the palladium metal layer is a palladium alloy layer including at least one metal of cobalt (Co), zinc (Zn), and an inorganic substance.

* * * * *